(12) United States Patent
Rhodes et al.

(10) Patent No.: US 7,666,703 B2
(45) Date of Patent: Feb. 23, 2010

(54) IMAGE SENSOR PIXEL HAVING A LATERAL DOPING PROFILE FORMED WITH INDIUM DOPING

(75) Inventors: Howard E. Rhodes, Boise, ID (US); Hidetoshi Nozaki, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 919 days.

(21) Appl. No.: 11/036,647

(22) Filed: Jan. 14, 2005

(65) Prior Publication Data

US 2006/0158538 A1 Jul. 20, 2006

(51) Int. Cl.
*H01L 21/00* (2006.01)
(52) U.S. Cl. .................... 438/57; 257/E27.132
(58) Field of Classification Search ........... 438/57, 438/87; 257/292, 607, 655, E27.132, E27.133
See application file for complete search history.

(56) References Cited

U.S. PATENT DOCUMENTS

| | | | |
|---|---|---|---|
| 5,181,093 A | 1/1993 | Kawaura | |
| 6,504,193 B1 | 1/2003 | Ishiwata et al. | |
| 7,387,908 B2 * | 6/2008 | Patrick | 438/73 |
| 7,432,543 B2 * | 10/2008 | Rhodes | 257/292 |
| 7,449,380 B2 * | 11/2008 | Williams et al. | 438/207 |
| 2004/0173799 A1 * | 9/2004 | Patrick | 257/72 |
| 2004/0188727 A1 | 9/2004 | Patrick | |

FOREIGN PATENT DOCUMENTS

| | | |
|---|---|---|
| EP | 1 450 410 A2 | 8/2004 |
| EP | 1 450 410 A3 | 4/2006 |
| EP | 1 667 232 A2 | 6/2006 |
| EP | 1 768 186 A2 | 3/2007 |
| EP | 1 833 093 A1 | 9/2007 |

OTHER PUBLICATIONS

European Search Report and Opinion dated Apr. 17, 2007, Application No. 05 257 876.2, Application filed Dec. 20, 2005; 9 pages.
European Office Action dated Sep. 21, 2007, Application No. 05 257 876.2, Application filed Dec. 20, 2005; 11 pages.
Response to European Office Action filed Feb. 1, 2008, Application No. 05 257 876.2, Application filed Dec. 20, 2005; 11 pages.
European Office Action dated Dec. 8, 2008, Application No. 05 257 876.2, Application filed Dec. 20, 2005; 4 pages.
Chinese First Office Action with English Translation, Application No. 200610054115, Application filed Jan. 13, 2006; 10 pages.
Taiwan Certificate of Patent dated Sep. 21, 2006, Invention No. I 262596, Application No. 094143732, Application filed Dec. 6, 2005; 4 pages.

* cited by examiner

*Primary Examiner*—Mark Prenty
(74) *Attorney, Agent, or Firm*—Blakely Sokoloff Taylor & Zafman, LLP

(57) ABSTRACT

An active pixel using a transfer gate that has a polysilicon gate doped with indium. The pixel includes a photosensitive element formed in a semiconductor substrate and an n-type floating node formed in the semiconductor substrate. An n-channel transfer transistor having a transfer gate is formed between the floating node and the photosensitive element. The pixel substrate has a laterally doping gradient doped with an indium dopant.

10 Claims, 5 Drawing Sheets

IMAGE SENSOR PIXEL HAVING A LATERAL DOPING PROFILE FORMED WITH INDIUM DOPING

TECHNICAL FIELD

The present invention relates to image sensors, and more particularly, to an image sensor that has pixels doped with indium.

BACKGROUND

Image sensors have become ubiquitous. They are widely used in digital still cameras, cellular phones, security cameras, medical, automobile, and other applications. The technology used to manufacture image sensors, and in particular CMOS image sensors, has continued to advance at great pace. For example, the demands of higher resolution and lower power consumption have encouraged the further miniaturization and integration of the image sensor.

Typically each pixel of an image sensor includes a photosensitive element, such as a photodiode, and one or more transistors for reading out the signal from the photosensitive element. For example, a transfer transistor is commonly used in a pixel using a four-transistor (or more) design. The transfer transistor has a transfer gate formed between the photosensitive element and a floating node.

One important issue for both CMOS and CCD image sensors is the potential barrier between the photosensitive element (such as a photodiode) and the transfer gate. The potential barriers and/or wells can prevent full charge transfer and give rise to image artifacts in solid stage imagers. These potential barriers and wells also give rise to image lag issues which occurs when the image signal (electrons) that remain in the photodiode after the image signal has been read out. If the image signal remains in the photodiode, then this image signal can be read out in the next read out as unwanted "old" signal. The old signal from each pixel depends on whether the pixel was focused on a bright or a dark area of the previous frame. The result is that a ghost image of the old scene appears in the new scene photograph or frame.

In image sensors, one method to try to ensure full read out across a transistor is to provide a lateral doping gradient with boron that drives electrons from the photosensitive side, across the transfer gate, to the drain side of the transferred gate (called the floating diffusion). However, it has been found that the addition of a laterally graded doping profile results in unwanted compensation of the photodiode N⁻ implant. While this lateral field can help with transport across the transfer gate, this doping and the photosensitive element/transfer gate interface may actually make the barrier and/or well performance worse. In other words, increasing the boron doping at the transfer gate edge to provide the lateral electrical field increases the barrier at the photosensitive element/transfer gate edge.

DETAILED DESCRIPTION

In the following description, numerous specific details are provided in order to give a thorough understanding of embodiments of the invention. One skilled in the relevant art will recognize, however, that the invention may be practiced without one or more of the specific details, or with other methods, components, materials, etc. In other instances, well known structures, materials, or operations are not shown or described in order to avoid obscuring aspects of the invention.

Referenced throughout the specification to "one embodiment" or "an embodiment" means that a particular feature, structure, or characteristic described in connection with the embodiment and included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
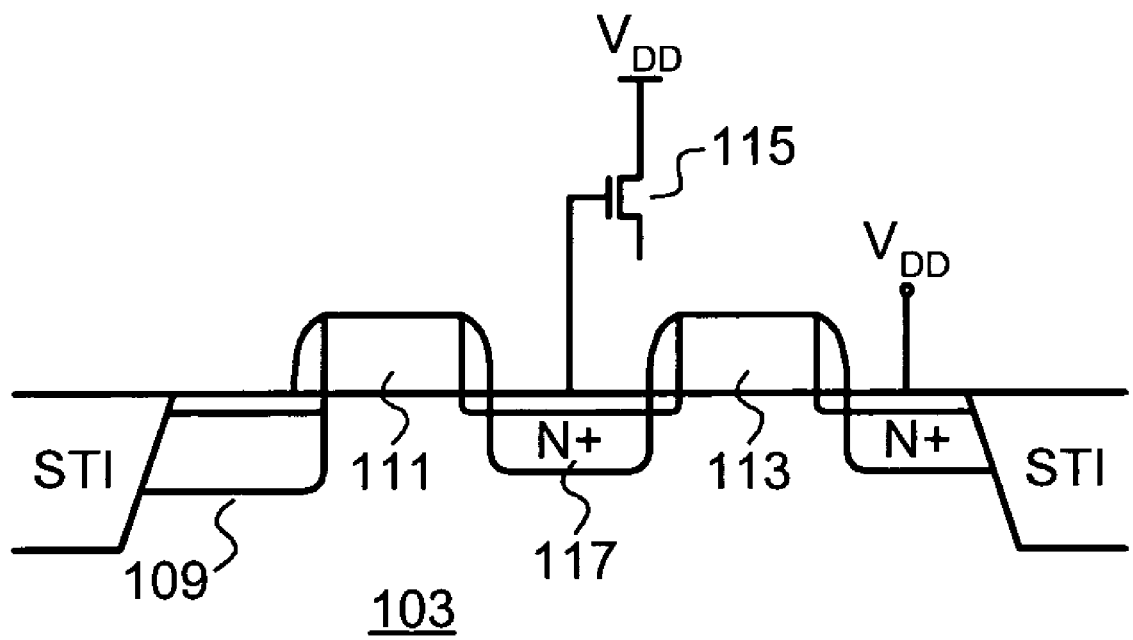
FIG. 1 is a prior art cross-sectional view of a four transistor pixel.

FIG. 1 shows a combination cross-sectional view of a prior art image sensor and active pixel that uses four transistors. This is known in the art as a 4T active pixel. However, it can be appreciated that the present invention can be used with any type of pixel design, including but not limited to 5T, 6T, and other designs, as well as with CCD or CMOS image sensors.

FIG. 1 shows a cross-section of a four-transistor a pixel 103, which is only one exemplar pixel in the pixel array. The pixel includes a photosensitive element 109, which in this embodiment is a pinned photodiode. However, the photosensitive element may be a photogate, photocapacitor, partially pinned photodiode, or unpinned photodiode.

The photodiode 109, outputs a signal that is used to modulate an amplification transistor 115. The amplification transistor 115 is also referred to as a source follower transistor. A transfer transistor having a transfer gate 111 is used to transfer the signal output by the photodiode 109 to a floating node 117 (N+ doped) and the gate of the amplification transistor 115.

In operation, during an integration period (also referred to as an exposure or accumulation period), the photodiode 109 stores charge (in response to incident light) that is held in the N⁻ layer of the photodiode 109. After the integration period, the transfer gate 111 is turned on to transfer the charge held in the N⁻ layer to the floating node 117. After the signal has been transferred to the floating node 117, the transfer gate 117 is turned off again for the start of a subsequent integration period. The signal on the floating node 117 is then used to modulate the amplification transistor 115. After readout, a reset transistor having a reset gate 113 resets the floating node 117 to a reference voltage. In one embodiment, the reference voltage is $V_{dd}$.

As noted above, the prior art teaches that a lateral doping gradient (or profile) is formed in order to aid in complete image signal transfer. However, in the prior art, the lateral doping gradient has been formed using boron as the dopant. The present invention recognizes that the use of boron to form a lateral doping gradient between the photodiode and the transfer gate has deficiencies.

Thus, the present invention uses indium to form the lateral doping gradient. In particular, while boron (specifically the B11 isotope) implant energies can be made very low to make a shallow implant, it has been found that when using such low implant energies, the boron implant will have a large "straggle." Straggle is generally defined to be the statistical fluctuation along an axis perpendicular to the axis of incidence of the dopant. Another definition is that straggle is the second moment of the implant distribution. A large straggle will result in a wide implant range for the boron implant. This results in unwanted compensation of the N– photodiode implant and an increase in the barrier at the photodiode/transfer gate interface. Further, the use of the dopant $BF_2$ provides similarly unacceptable results to the use of the B11 dopant.

In accordance with the present invention, the use of an indium implantation at energies that provide an equivalent shallow implant range ($R_P$) achieves a much smaller implant straggle. This eliminates the issues in the current art. A transfer gate and pixel that uses indium can achieve a lateral electric field gradient and a much lower barrier/well potential at the same time. In this manner, a solid state imager (CCD or CMOS) can be created that does not suffer image lag issues.

Figure 2:
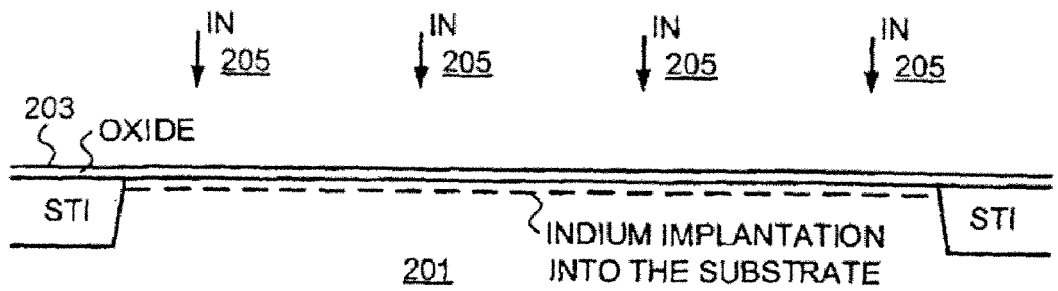
FIGS. 2-4 are cross-sectional views illustrating a method of forming a transfer gate in accordance with the present invention.

Turning to FIG. 2, a semiconductor substrate 201 with shallow trench isolations (STI) is shown. The region between the two STIs defines the active area of the pixel. In accordance with the present invention, a thin oxide 203 is formed atop of the substrate 201. Next, a first shallow indium implant (In) step 205 is performed. In one embodiment, the depth of the indium implantation is 140 to 800 angstroms, and more preferably between 200 and 450 angstroms. Further, the indium implantation is performed at an energy of between 20 keV and 200 keV, and preferably between 20 and 100 keV. The dosage may be, for example, be between 5e11 to 8e12 ions/$cm^2$.

While in the embodiment described herein shows the indium implant is performed after the thin oxide 203 is formed, the indium implant may be performed in a wide variety of junctures in the manufacturing process. For example, the indium implant may be performed after formation of the pad oxide, the sacrificial oxide, or the gate oxide.

In one alternative embodiment, the indium implant is performed after and through the sacrificial oxide simply because it may be preferred to not coat photoresist on a gate oxide and having to clean the wafers prior to polysilicon deposition as shown in the Figures. However, in other CMOS manufacturing processes, the photoresist 301 is typically formed on top of a gate oxide in "dual gate oxide processes."

Still alternatively, the indium implantation may be performed after deposition of the gate polysilicon, i.e., through the blanket polysilicon deposition and through the gate oxide and into the underlying silicon. This is especially feasible if the polysilicon gate is relatively thin (on the order of less than 2000 Å and preferably less than 1200 Å). In such a case, the indium implant is done after the polysilicon gate oxidation and so does not suffer any enhanced diffusion due to the gate oxidation. Thus, there are multiple potential junctures for performing the indium implant in the process flow.

Figure 3:
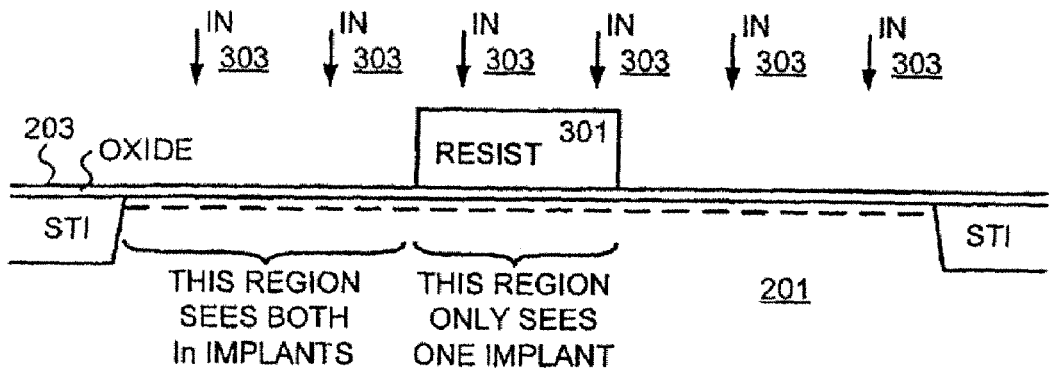

Next, turning to FIG. 3, a photoresist mask 301 is formed onto the surface of the oxide. The photoresist mask 301 is between the two STI regions. As will be seen in further detail below, the photoresist mask 301 is used to delineate a portion of the pixel area that is only subject to a single indium implantation. Thus, in FIG. 3, using the photoresist 301 as a mask, a second indium implantation 303 is performed. In one embodiment, the depth of the second indium implantation is 140 to 800 angstroms, and more preferably between 200 and 450 angstroms. Further, the second indium implantation is performed at an energy of between 20 keV and 200 keV, and preferably between 20 and 100 keV. The dosage may be, for example, be between 5e11 to 8e12 ions/$cm^2$.

Figure 4:
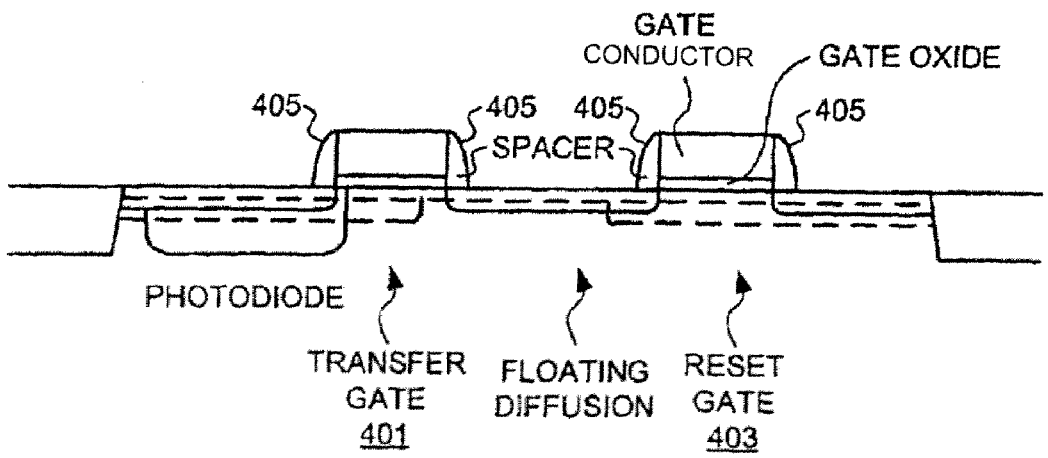

After this second indium implantation 303 is performed, as seen in FIG. 4, conventional prior steps are used to form the transfer gate 401, the reset gate 403, and the sidewall spacers 405 to form the transfer transistor and reset transistor commonly used in the 4T transistor of FIG. 1. Further, conventional n-type implant steps (using for example phosphorous or arsenic) are further performed to form the photodiode, the lightly doped drains, and floating diffusion.

Note that the second indium implantation 303 extends only partially underneath the transfer gate and partially into the floating diffusion area. The photoresist mask 301 thus covers a portion of the transfer gate 401 and a portion of the floating diffusion. This provides a lateral doping gradient that aids in the complete signal transfer from the photodiode to the floating diffusion.

Figure 7:
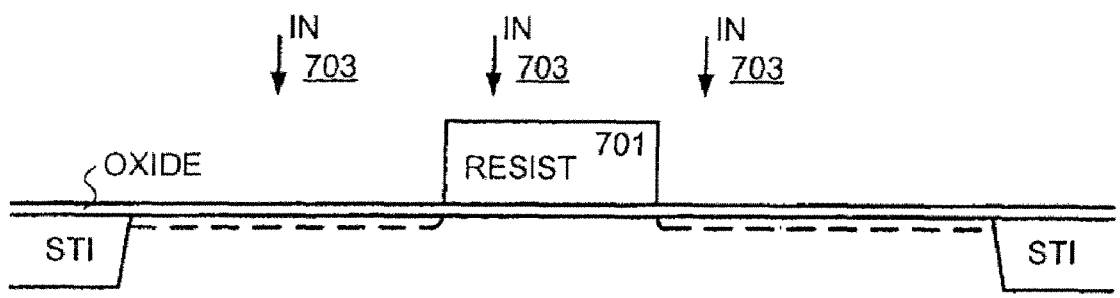
FIGS. 7 and 8 are cross-sectional views of a semiconductor substrate illustrating an alternative embodiment of the present invention.
Figure 8:
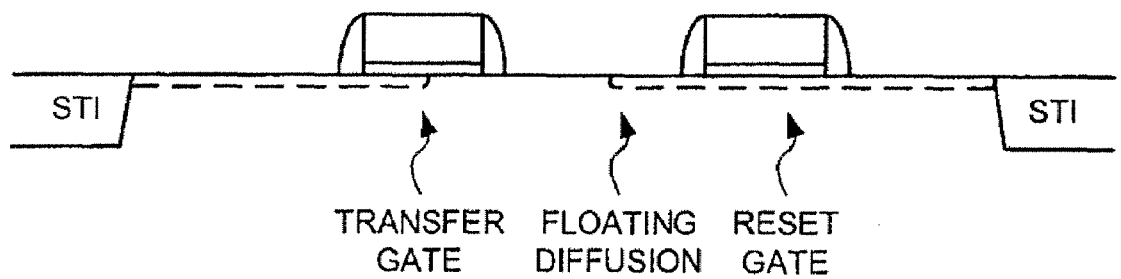

In an alternative embodiment shown in FIGS. 7 and 8, a single indium implantation is used. In this embodiment, a photoresist mask 701 is deposited onto the oxide. Then a single indium doping process 703 is performed. In one embodiment, the depth of the indium implantation is 140 to 800 angstroms, and more preferably between 200 and 450 angstroms. Further, the indium implantation is performed at an energy of between 20 keV and 200 keV, and preferably between 20 and 100 keV. The dosage may be, for example, be between 5e11 to 8e12 ions/$cm^2$. The photoresist mask 701 is then removed and using conventional steps, the transfer gate and reset gates are formed in the active area of the pixel.

Note that the indium doping only extends partially underneath the transfer gate and partially into the floating diffusion. Again, this provides a lateral doping gradient that aids in signal transfer. The advantage of this process is that only a single indium implant procedure is needed.

Figure 5:
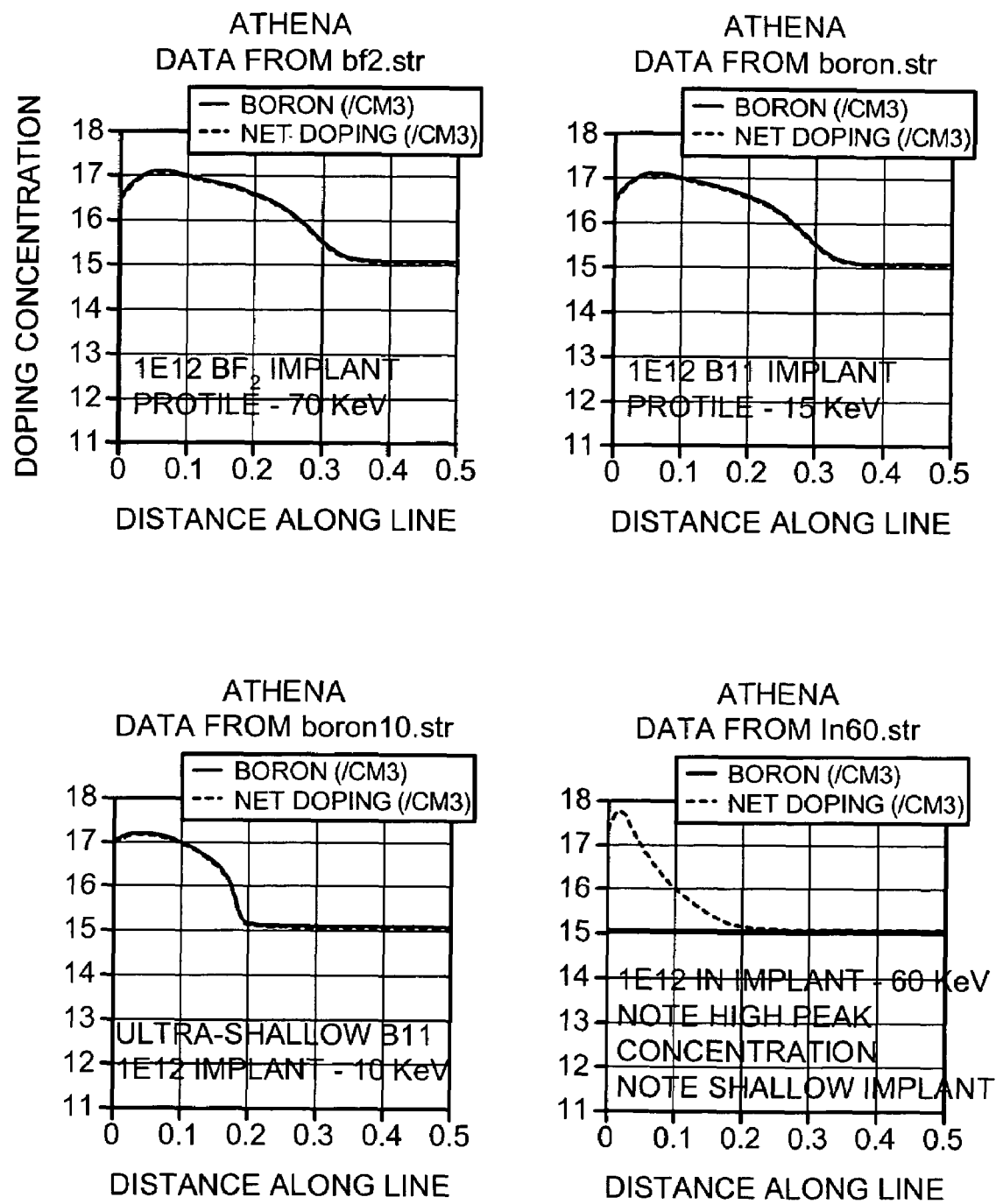
FIGS. 5 and 6 are graphs illustrating doping profiles and calculated electrical potentials comparing pixels formed in accordance with the prior art and the present invention.

FIG. 5 shows the various implant profiles using a B11 isotope, a $BF_2$ dopant, and an indium implant. As can be seen in FIG. 5, the indium implant has a high peak concentration with little lateral straggle.

Figure 6:
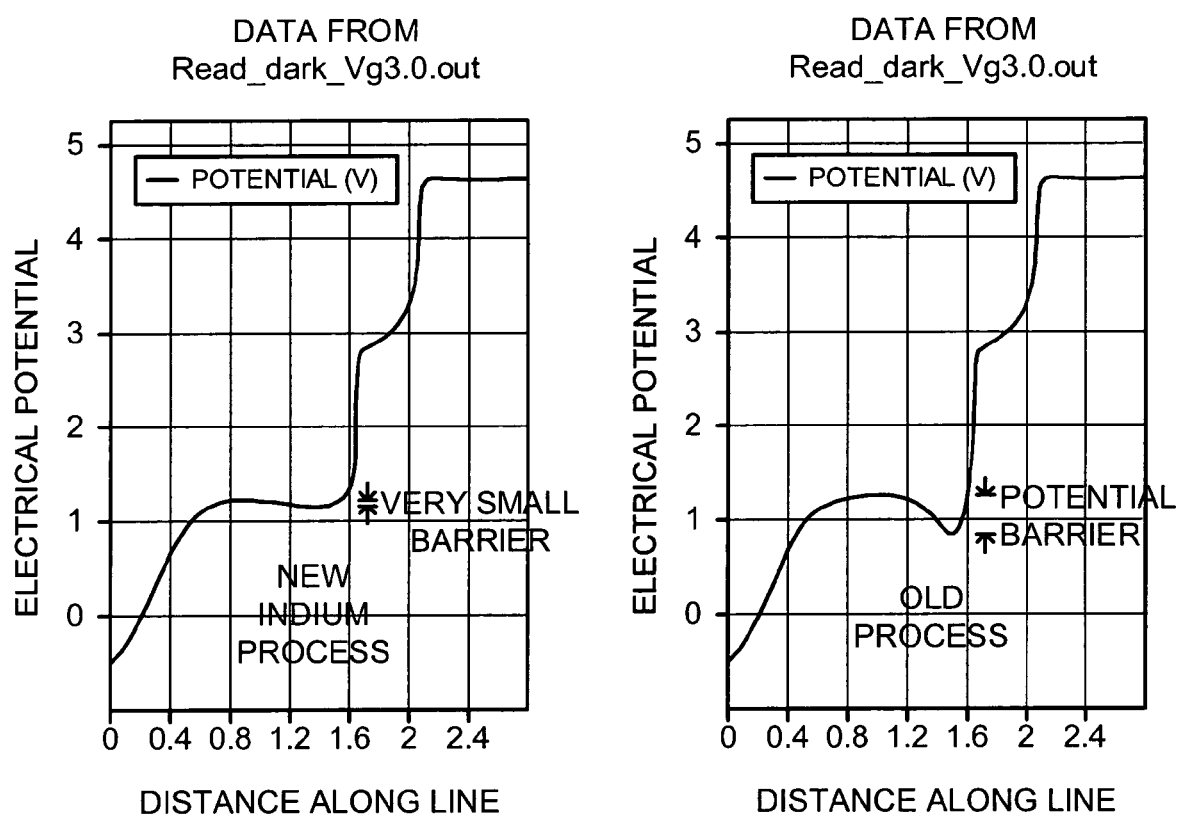

FIG. 6 shows a chart of the electrical potential using a conventional prior art boron implant compared to an indium implant of the present invention. At the point of interface between the photodiode and the transfer gate, there is a small barrier that must be overcome in comparison to the old prior art process.

Thus, from the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method for forming a pixel in an active area of a semiconductor substrate comprising:

forming a lateral doping gradient from an indium implant into said active area of said semiconductor substrate, said lateral doping gradient having a higher dopant concentration in a first portion of said active area than a second portion of said active area;

forming a photosensitive element in said semiconductor substrate and in said first portion of said active area;

forming a floating node in said semiconductor substrate, a portion of said floating node overlapping with at least a part of said second portion of said active area; and forming a transfer transistor having a transfer gate between said photosensitive element and said floating node, said transfer gate overlapping with at least a part of said second portion of said active area.

2. The method of claim 1 wherein said photosensitive element is a photodiode, partially pinned photodiode, pinned photodiode, photogate, or photocapacitor.

3. The method of claim 1 further including forming an amplification transistor controlled by said floating node.

4. The method of claim 1 wherein the transfer gate includes a gate polysilicon and wherein said indium implant is performed after deposition of the gate polysilicon.

5. The method of claim 1 wherein said indium implant is performed after a sacrificial oxide has been formed.

6. A method for forming a pixel in an active area of a semiconductor substrate comprising:

forming an indium implant into said active area of said semiconductor substrate, said indium implant being masked in a portion of said active area;

forming a photosensitive element in said semiconductor substrate;

forming a floating node in said semiconductor substrate, such that a first portion of said floating node overlaps with a part of said portion of said active area masked from said indium implant and a second portion of said floating node is subject to said indium implant; and forming a transfer transistor having a transfer gate between said photosensitive element and said floating node, such that a first portion of said transfer gate overlaps with a part of said portion of said active area masked from said indium implant and a second portion of said transfer gate is subject to said indium implant.

7. The method of claim 6 wherein said photosensitive element is a photodiode, partially pinned photodiode, pinned photodiode, photogate, or photocapacitor.

8. The method of claim 6 further including forming an amplification transistor controlled by said floating node.

9. The method of claim 6 wherein the transfer gate includes a gate polysilicon and wherein said indium implant is performed after deposition of the gate polysilicon.

10. The method of claim 6 wherein said indium implant is performed after a sacrificial oxide has been formed.

* * * * *

UNITED STATES PATENT AND TRADEMARK OFFICE
CERTIFICATE OF CORRECTION

| | |
|---|---|
| PATENT NO. | : 7,666,703 B2 |
| APPLICATION NO. | : 11/036647 |
| DATED | : February 23, 2010 |
| INVENTOR(S) | : Rhodes et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1441 days.

Signed and Sealed this

Seventh Day of December, 2010

David J. Kappos
*Director of the United States Patent and Trademark Office*